US010923543B1

(12) United States Patent
Chen (10) Patent No.: US 10,923,543 B1
(45) Date of Patent: Feb. 16, 2021

(54) DISPLAY PANEL AND METHOD OF FORMING THE SAME, DISPLAY DEVICE

(71) Applicant: BOE TECHNOLOGY GROUP CO., LTD., Beijing (CN)

(72) Inventor: Yipeng Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/811,532

(22) Filed: Mar. 6, 2020

(30) Foreign Application Priority Data

Nov. 22, 2019 (CN) .......................... 201911157716.1

(51) Int. Cl.
*G09G 3/3225* (2016.01)
*H01L 27/32* (2006.01)
*H01L 51/56* (2006.01)

(52) U.S. Cl.
CPC ....... *H01L 27/3246* (2013.01); *G09G 3/3225* (2013.01); *H01L 27/3218* (2013.01); *H01L 27/3248* (2013.01); *H01L 27/3276* (2013.01); *H01L 27/3283* (2013.01); *H01L 51/56* (2013.01)

(58) Field of Classification Search
CPC ............. H01L 27/3246; H01L 27/3218; H01L 27/3248; H01L 27/3276; H01L 27/3283; H01L 51/56; G09G 3/3225
See application file for complete search history.

(56) References Cited

U.S. PATENT DOCUMENTS

| 10,009,683 | B2 * | 6/2018 | Choi | .......................... | H04R 9/02 |
| 10,014,361 | B2 * | 7/2018 | Choi | .................... | H01L 51/5228 |
| 10,022,966 | B2 * | 7/2018 | Lowrance | ................ | B41J 3/407 |
| 10,032,839 | B2 * | 7/2018 | Kang | ................... | G09G 3/3266 |

* cited by examiner

*Primary Examiner* — Sejoon Ahn
(74) *Attorney, Agent, or Firm* — Westman, Champlin & Koehler, P.A.

(57) ABSTRACT

A display panel and a method of forming the same, a display device are provided. The method includes: forming an array layer on a base substrate; forming an AMOLED subpixel in the first display area and a PMOLED subpixel in the second display area; where the forming the PMOLED subpixel includes: forming, on the array layer, a plurality of third electrodes arranged in an array form; forming a second pixel definition layer on the third electrodes; forming a first partition pad between adjacent two rows or columns of pixel units on the second pixel definition layer; and depositing a transparent conductive thin film on a resultant base substrate, where the transparent conductive thin film is separated into bar-like fourth electrodes by the first partition pad in the second display area.

13 Claims, 9 Drawing Sheets

DISPLAY PANEL AND METHOD OF FORMING THE SAME, DISPLAY DEVICE

CROSS REFERENCE OF RELATED APPLICATION

This application claims a priority to Chinese Patent Application No. 201911157716.1 filed on Nov. 22, 2019, the disclosures of which are incorporated in their entirety by reference herein.

TECHNICAL FIELD

The present disclosure relates to field of display technology, and in particular to a display panel and a method of forming the same, a display device.

BACKGROUND

At present, the display panel with full screen design is more and more popular with consumers, and the full screen has become the main way of display devices such as mobile phones. In order to achieve a full screen display, the design spaces of camera, infrared sensor, handset and other devices are compressed, and placing the camera, infrared sensor and other devices under the display screen becomes the main ways to solve the technical issues of full screen. In order to achieve a full screen display, the display areas corresponding to the cameras, infrared sensors and other devices shall also be able to display.

In related art, a display panel is introduced, which has a first display area and a second display area, wherein the first display area uses an active matrix Organic Light-Emitting Diode (AMOLED) structure and the second display area uses a Passive Matrix Organic Light-Emitting Diode (PMOLED) structure to display, and the camera, infrared sensors and other devices are arranged on the back of the second display area, so as to achieve a full screen display. For such display panel, when forming AMOLED subpixels and PMOLLED subpixels, the manufacturing process is complicated, resulting in high cost of display panel production.

SUMMARY

A method of forming a display panel is provided in the present disclosure, where the display panel includes a first display area and a second display area, and the method includes:

forming an array layer on a base substrate;

forming, at a side of the array layer away from the base substrate, an AMOLED subpixel in the first display area and a PMOLED subpixel in the second display area;

where the forming at the side of the array layer away from the base substrate the PMOLED subpixel in the second display area includes:

forming, on the array layer, a plurality of third electrodes arranged in an array form in the second display area;

forming a second pixel definition layer on the third electrodes, where the second pixel definition layer includes second openings exposing the third electrodes;

forming a partition structure layer on the second pixel definition layer, where the partition structure layer includes a first partition pad between adjacent two rows or columns of pixel units; and depositing a transparent conductive thin film on a resultant base substrate, where the transparent conductive thin film is separated into bar-like fourth electrodes by the first partition pad in the second display area.

Optionally, an orthographic projection of a surface of the first partition pad adjacent to the base substrate onto the base substrate is within an orthographic projection of a surface of the first partition pad away from the base substrate onto the base substrate.

Optionally, prior to the depositing the transparent conductive thin film on the resultant base substrate, the method further includes:

forming a second light-emitting structure layer in the second openings;

or prior to the forming the partition structure layer on the second pixel definition layer, the method further includes:

forming a second light-emitting structure layer in the second openings.

Optionally, the forming, at the side of the array layer away from the base substrate, the AMOLED subpixel in the first display area includes:

forming, at the side of the array layer away from the base substrate, a first electrode in the first display area, where the first electrode and the third electrodes are formed by one patterning process;

forming a first pixel definition layer on the first electrode, where the first pixel definition layer includes a first opening exposing the first electrode, and the first pixel definition layer and the second pixel definition layer are formed by one masking process;

forming a first light-emitting structure layer in the first opening, where the first light-emitting structure layer and the second light-emitting structure layer are formed simultaneously; and forming a second electrode on the resultant base substrate, where the second electrode and the fourth electrodes are formed simultaneously.

Optionally, a material of the second pixel definition layer includes a positive organic material, and a material of the first partition pad includes a negative organic material; or a material of the second pixel definition layer includes a negative organic material, and a material of the first partition pad includes a positive organic material.

A display panel is further provided in the present disclosure, including:

a first display area;
a second display area;
a base substrate;
an array layer on the base substrate; and
a light-emitting functional layer at a side of the array layer away from the base substrate, where the light-emitting functional layer includes an AMOLED subpixel in the first display area and a plurality of PMOLED subpixels in the second display area;

where the PMOLED subpixels are arranged in an array form and includes third electrodes, a second pixel definition layer is on the third electrodes, the second pixel definition layer includes second openings exposing the third electrodes, a partition structure layer is on the second pixel definition layer and includes a first partition pad between adjacent two rows or columns of pixel units;

the PMOLED subpixels further include a second light-emitting structure in the second opening and on the third electrodes and a transparent conductive thin film on the partition structure layer, and the transparent conductive thin film is separated into bar-like fourth electrodes by the first partition pad.

Optionally, an orthographic projection of a surface of the first partition pad adjacent to the base substrate onto the base substrate is within an orthographic projection of a surface of the first partition pad away from the base substrate onto the base substrate.

Optionally, the array layer includes a thin-film transistor in the first display area, the AMOLED subpixel includes a first electrode electrically connected to the thin-film transistor, a first pixel definition layer is on the first electrode, the first pixel definition layer includes a first opening exposing the first electrode, a second partition pad is on the first pixel definition layer, the first partition pad and the second partition pad are formed simultaneously;

the AMOLED subpixel further includes a first light-emitting structure layer in the first opening and on the first electrode and the first electrode definition layer and a second electrode on the first light-emitting structure layer.

Optionally, a material of the fourth electrode includes a transparent conductive material.

Optionally, in the second display area, each pixel unit includes a red subpixel, a green subpixel and a blue subpixel, and an aperture ratio of each pixel unit is 15% to 25%.

Optionally, in each pixel unit, lines connecting centers of the red subpixel, the green subpixel and the blue subpixel form a triangle.

Optionally, the blue subpixel has a pattern of a first regular hexagon, the red subpixel has a pattern of a second regular hexagon, and the green subpixel has a rhombus shape, and the pattern of the blue subpixel is larger than the pattern of the red subpixel.

Optionally, in the second display area, the third electrodes of adjacent two subpixels with a same color in a same column are connected via a third electrode connecting line, where the third electrode connecting line is zigzag.

Optionally, the third electrode connecting line includes a plurality of curved segments, or the third electrode connecting line has an S-shape;

or, the third electrode connecting line includes a first curved segment and a second curved segment having opposite bending directions.

Optionally, a width of third electrode connecting line is 4 μm to 6 μm.

Optionally, an interval between adjacent two PMOLED subpixels is 26.4 μm to 32 μm.

A display device including the display panel hereinabove is further provided in the present disclosure.

Optionally, the display device further includes a first control circuit electrically connected to a driving circuit in the first display area and a second control circuit electrically connected to a first voltage signal line and a second voltage signal line in the second display area;

where the first control circuit is configured to control the driving circuit, to control the first display area to display, the second control circuit is configured to control the second display area to display.

BRIEF DESCRIPTION OF THE DRAWINGS

In order to more clearly explain the embodiments of the present disclosure or the technical solutions in the prior art, the drawings used in the description of the embodiments or the prior art will be briefly introduced below. Obviously, the drawings in the following description are merely some embodiments of the present disclosure. For those of ordinary skill in the art, other drawings may be obtained based on these drawings without creative work.

DETAILED DESCRIPTION

In the following, the technical solutions in the embodiments of the present disclosure will be clearly and completely described with reference to the drawings in the embodiments of the present disclosure. Obviously, the described embodiments are only a part of the embodiments of the present disclosure, but not all of the embodiments. Based on the embodiments of the present disclosure, all other embodiments obtained by a person of ordinary skill in the art without creative efforts shall fall within the scope of the present disclosure.

Figure 1:
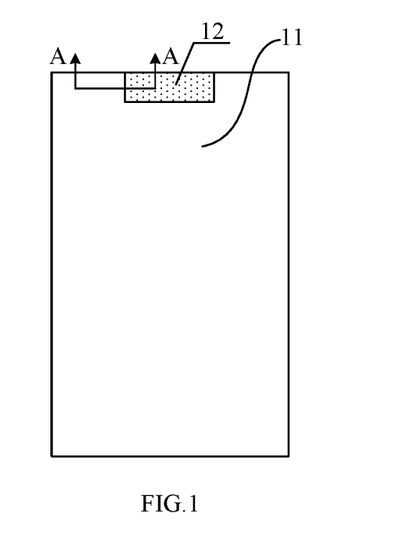
FIG. 1 is a schematic view of a display panel in some embodiments of the present disclosure.

FIG. 1 is a schematic view of a display panel in some embodiments of the present disclosure. As shown in FIG. 1, the display panel includes a first display area 11 and a second display area 12. In some embodiments, the second display area 12 is at one edge of the first display area 11. In some embodiments, the second display area 12 can also be arranged within the first display area 11, that is, the first display area 11 is arranged around the second display area 12.

Figure 2:
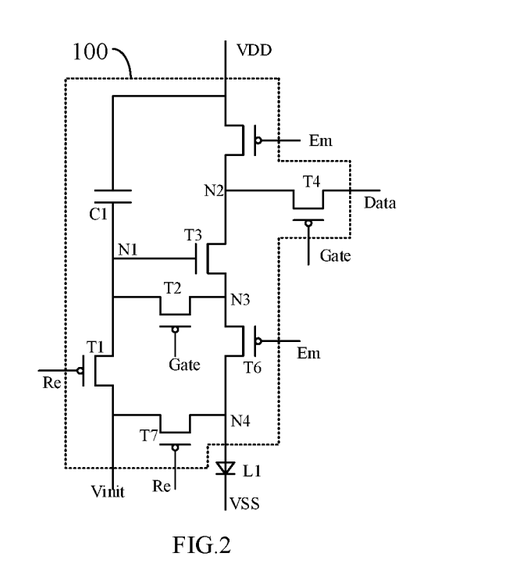
FIG. 2 is a schematic view of a driving circuit and a first light-emitting structure of a first subpixel in a first display area in some embodiments of the present disclosure.

FIG. 2 is a schematic view of a driving circuit and a first light-emitting structure of a first subpixel in a first display area in some embodiments of the present disclosure. As shown in FIG. 2, the first display area 11 includes multiple first subpixels (such as R, G, and B), each of which includes the first light-emitting device L1 and the driving circuit 100 configured to drive the light-emitting device L1, as shown in FIG. 2. That is, the first light-emitting device L1 of the first display area 11 uses an independent thin film transistor in the driving circuit 100 to control each first subpixel to emit light, that is, the driving light-emitting mode of the first display area 11 is the active driving light-emitting. The working principle of the driving circuit 100 is a common technology in this field, and will not be described herein again. Therefore, the display panel structure of the first display area 11 is an Active Matrix Organic Light-Emitting Diode (AMOLED) structure.

Figure 3A:
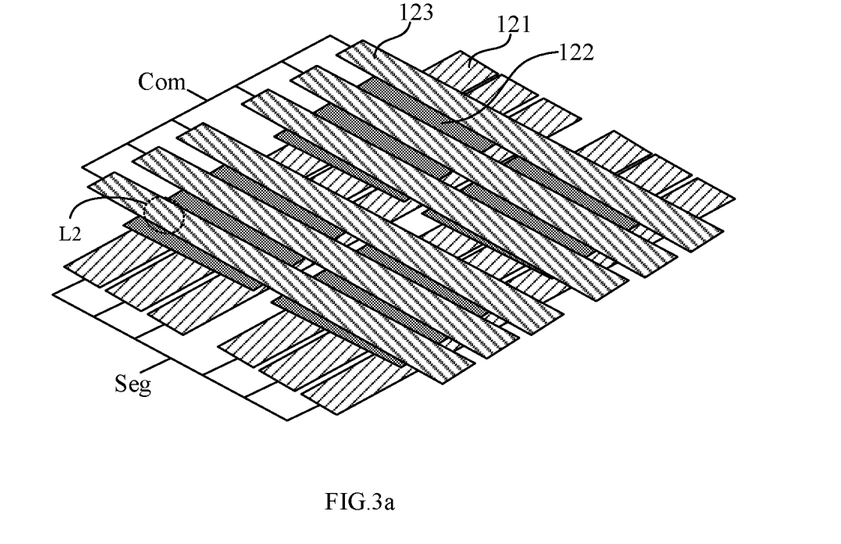
FIG. 3a is a schematic view of a second display area in some embodiments of the present disclosure.
Figure 3B:
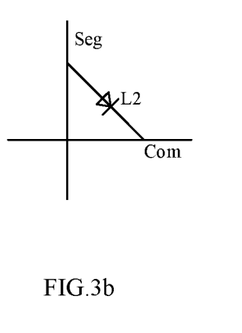
FIG. 3b is a schematic view of a driving principle of a second display area in some embodiments of the present disclosure.
Figure 3C:
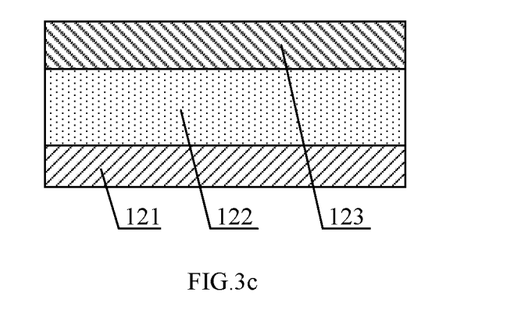
FIG. 3c is sectional view of a second light-emitting structure in some embodiments of the present disclosure.

FIG. 3a is a schematic view of a second display area in some embodiments of the present disclosure, FIG. 3b is a schematic view of a driving principle of a second display area in some embodiments of the present disclosure, and FIG. 3c is sectional view of a second light-emitting structure in some embodiments of the present disclosure. As shown in FIG. 3a, FIG. 3b and FIG. 3c, the second display area includes multiple stripe-like third electrodes 121 extending in a first direction and multiple stripe-like fourth electrodes 123 extending in a second direction, as well as a second light-emitting layer 122 sandwiched between the third electrodes 121 and fourth electrodes 123, and the area where the third electrodes 121, the second light-emitting structure layer 122 and the fourth electrodes 123 overlap forms the second light-emitting device L2. The first and second directions are perpendicular to each other. The second display area 12 includes multiple second subpixels (such as R, G, B), as well as the first voltage signal line Seg and the second voltage signal line Com, each of the second subpixels includes the second light-emitting device L2, the second light-emitting device L2 includes the third electrode 121, the fourth electrode 123, and the second light-emitting structure lay 122 between the third electrode 121 and fourth electrode 123. The third electrode 121 is electrically connected to the first voltage signal line Seg, the fourth electrode 123 is electrically connected to the second voltage signal line Com, and the second light-emitting device L2 of the second display area 12 simply forms an array with the third electrode 121, the fourth electrode 123 and the second light-emitting structure 122, to illuminate the second subpixel in a scanning manner. Therefore, the driving light-emitting mode of the second display area 12 is passively driving. That is, the display panel structure of the second display area 12 is a Passive Matrix Organic Light-Emitting Diode (PMOLED) structure. The third electrode is commonly an anode, and the fourth electrode is commonly a cathode. Because the AMOLED structure includes a thin-film transistor structure, the thin-film transistor structure has more metal layers. In this disclosure, the second display area 12 has a PMOLED structure, with only two metal layers of the cathode layer and the anode layer, and no metal layer is in the thin-film transistor structure, thereby improving the transmittance of the second display area 12. When the sensor module, such as camera, infrared sensor, handset and other devices are arranged in the second display area, the low transmittance of the display panel area corresponding to the structure of the camera, infrared sensor and other devices in the related art may be solved.

In some embodiments of the present disclosure, sensor modules, such as cameras, infrared sensors, handsets, etc., are arranged behind the display panel corresponding to the second display area, so as to achieve a full screen display and improve the transmittance of the second display area.

In some embodiments of the present disclosure, the material of the fourth electrode 123 may be a transparent conductive material instead of a conventional Mg/Ag material, thereby further improving the transmittance of the second display area. Transparent conductive materials may be indium zinc oxide (IZO), indium tin oxide (ITO), etc. The transmittance of indium-zinc oxide to visible and infrared light is about 90%, while that of conventional Mg/Ag materials is about 50%, so the indium-zinc oxide may greatly increase the transmittance of the second display area. The material of the third electrode 121 may include ITO/Ag/ITO, etc.

In FIG. 1, the shape of the second display area 12 is rectangular, and in practice, the shape of the second display area may be any one or combination of circles, ellipses, or directions.

In order to further improve the transmittance of the second display area 12 and prolong the service life of the second light-emitting device L2, in some embodiments of the present disclosure, in the second display area, the aperture ratio of each pixel unit is 15%~25%.

Figure 4:
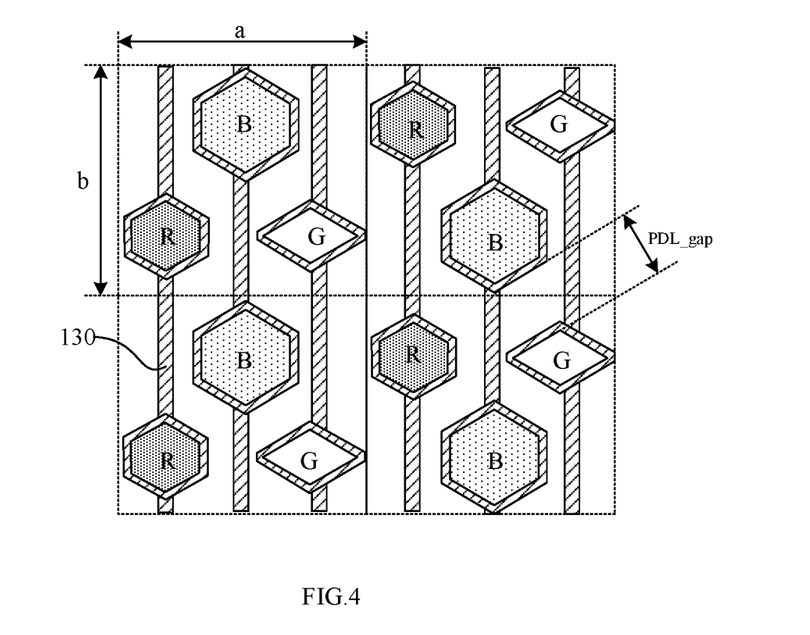
FIG. 4 is a plan view of a pixel unit in a second display area of a 278 PPI display panel in some embodiments of the present disclosure.

FIG. 4 is a plan view of a pixel unit in a second display area of a 278 PPI display panel in some embodiments of the present disclosure. As shown in FIG. 4, in the second display area, each pixel unit may include red (R) subpixels, green (G) subpixels, and blue (B) subpixels, and the R, G, and B subpixels in each pixel unit are arranged in a form of Chinese character "品". In other words, the connecting lines of centers of the red (R) subpixel, the green (G) subpixel and the blue (B) subpixel in each pixel unit form a triangle, that is, the three subpixels are at the three vertices of the triangle.

In FIG. 4, the area S1 of a pixel unit with a length a and a width b is shown. The aperture ratio of a pixel unit is 15%~25%, that is, a ratio of the sum of the area of R, G, and B subpixels in each pixel unit to S1 is 15%~25%. In order to balance the lifetime of R, G, B subpixels in a pixel unit, the area of R, G, B subpixels may be determined based on the experience values in this field (that is, the empirical ratio of R, G, B subpixel areas) and the aperture ratio of the pixel unit, so as to determine the pixel unit.

It is easy to understand that the area of a structure mentioned here may be understood as the area of the orthographic projection of the structure onto the base of the display panel.

As shown in FIG. 4, in the second display area, the pattern of the B subpixel is the first regular hexagon, the pattern of the R subpixel is the second regular hexagon, and the pattern of the G subpixel is the rhombus, where the side length of the second regular hexagon is smaller than the side length of the first regular hexagon.

FIG. 4 also shows the connecting line between subpixels in each column, namely the third electrode connecting line 130. In some embodiments of the present disclosure, a width of the third electrode connecting line 130 is 4 μm~6 μm, and the third electrode connecting line 130 may be set to 5 μm.

"the width of the third electrode connecting line" is the dimension of the third electrode connecting line in a direction perpendicular to its extension direction. Such width of the third electrode connecting line not only effectively ensures the connection between adjacent third electrodes, but also has no effect on the transmittance of the second display area. In some embodiments of the present disclosure, the PDL_gap between adjacent subpixels (i.e., the minimum distance between the luminescence boundaries of adjacent subpixels) is 26.4 μm~32 μm. The smaller the PDL_gap is, the larger the number of subpixels in a unit area will be, the larger the aperture ratio will be; similarly, the larger the PDL_gap is, the smaller the aperture ratio will be. FIG. 4 illustrates the interval between two adjacent G-subpixels in the same column.

Table 1 shows the comparison of different aperture ratios in the second display area of the 278 PPI display panel. In Table 1, when the aperture ratio is 25%, the width of the third electrode connecting line 130 is 5 μm, the PDL_gap is 26.4 μm, and the transmittance of the corresponding second display area is 52.8%; the aperture ratio is 20%, the width of the third electrode connecting line 130 is 5 μm, the PDL_gap is 28.5 μm, and the transmittance of the corresponding second display area is 57.3%; the aperture ratio is 15%, the width of the third electrode connecting line 130 is 5 μm, the PDL_gap is 32 μm, and the transmittance of the corresponding second display area is 63.2%.

TABLE 1 shows the transmittances of the second display area in case of different aperture ratios of the 278 PPI display panel.

| aperture ratio | 25% | 20% | 15% |
|---|---|---|---|
| width of third electrode connecting line | 5 μm | 5 μm | 5 μm |
| PDL_gap | 26.4 μm | 28.5 μm | 32 μm |
| transmittance of second display area | 52.8% | 57.3% | 63.2% |

Figure 5A:
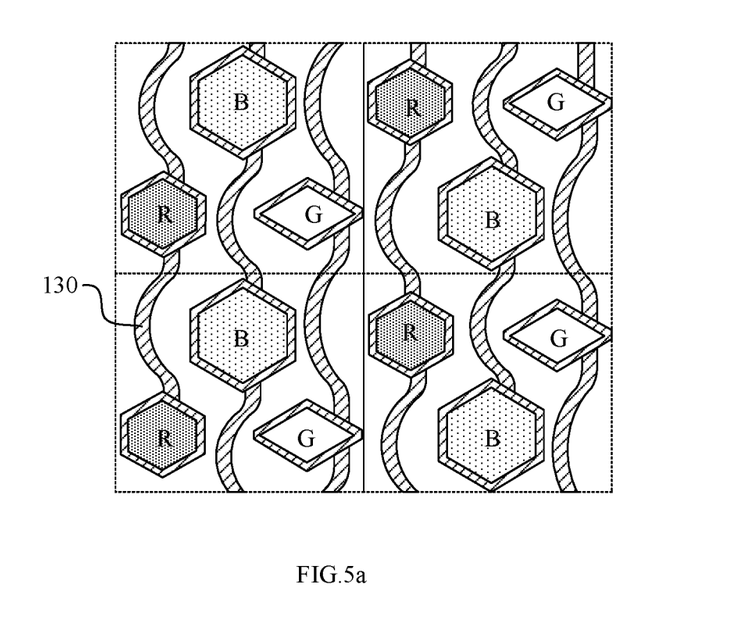
FIG. 5a is a schematic view of a third electrode connecting line in some embodiments of the present disclosure.
Figure 5B:
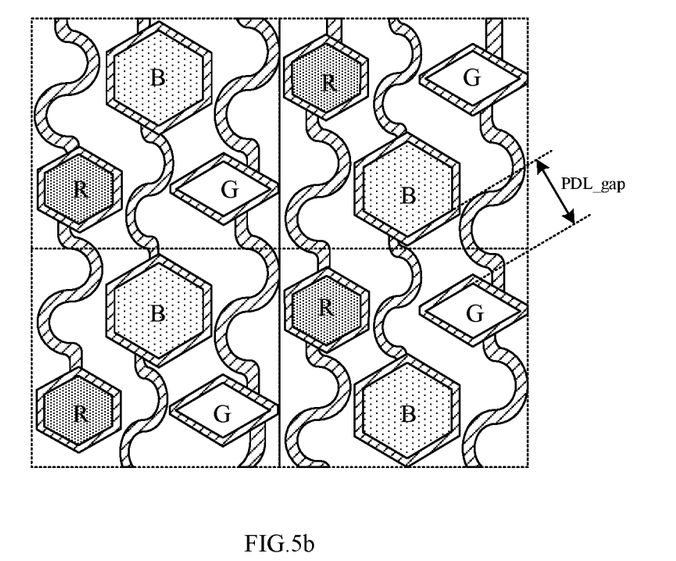
FIG. 5b is a schematic view of a third electrode connecting line in some embodiments of the present disclosure.
Figure 5C:
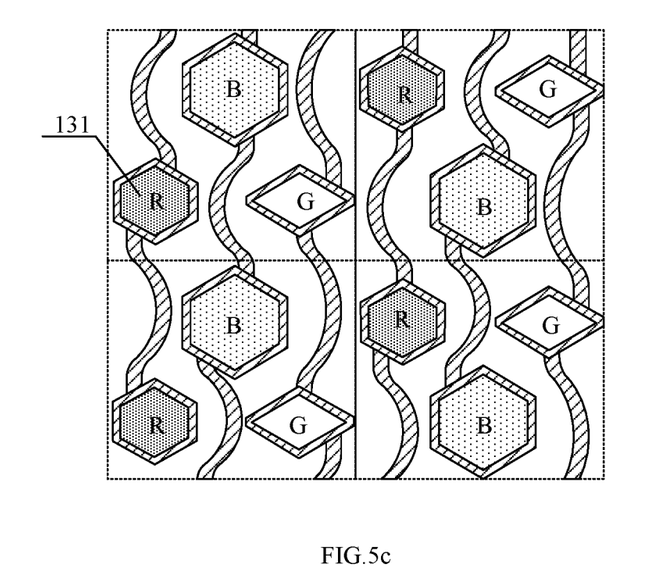
FIG. 5c is a schematic view of a third electrode connecting line in some embodiments of the present disclosure.

FIG. 5a is a schematic view of a third electrode connecting line in some embodiments of the present disclosure; FIG. 5b is a schematic view of a third electrode connecting line in some embodiments of the present disclosure; and FIG. 5c is a schematic view of a third electrode connecting line in some embodiments of the present disclosure. In FIG. 4, the third electrode connecting line 130 is a straight line. In some embodiments of the present disclosure, the pattern of the third electrode connecting line 130 may be a zigzag line, specifically, in some embodiments of the present disclosure, as shown in FIG. 5a, the pattern of the third electrode connecting line is curved, or, as shown in FIG. 5b, the pattern of the third electrode connecting line is of an "S" shape, or, in the same column, the third electrode connecting line includes a first curved segment and a second curved segment having opposite bending directions. For example, in FIG. 5c, the third electrode connecting line above R subpixel 131 is bend to the left, and the third electrode connecting line below R subpixel 131 is bend to the right.

In a display device, a sensor module, such as a camera, an infrared sensor, a handset, etc., is usually arranged in the second display area. When the third electrode connecting line is a zigzag line pattern as shown in FIG. 5a, FIG. 5B or FIG. 5c, a satisfied transmittance may be obtained, the diffraction during camera imaging may be reduced and the imaging effect of the camera may be improved. In a specific example, for 278 PPI display panel, when the aperture ratio of the second display area is 20%, and the PDL_gap is 28.5 μm, the transmittance of the second display area is 55%, and the imaging effect of the camera in the second display area is better.

Figure 6:
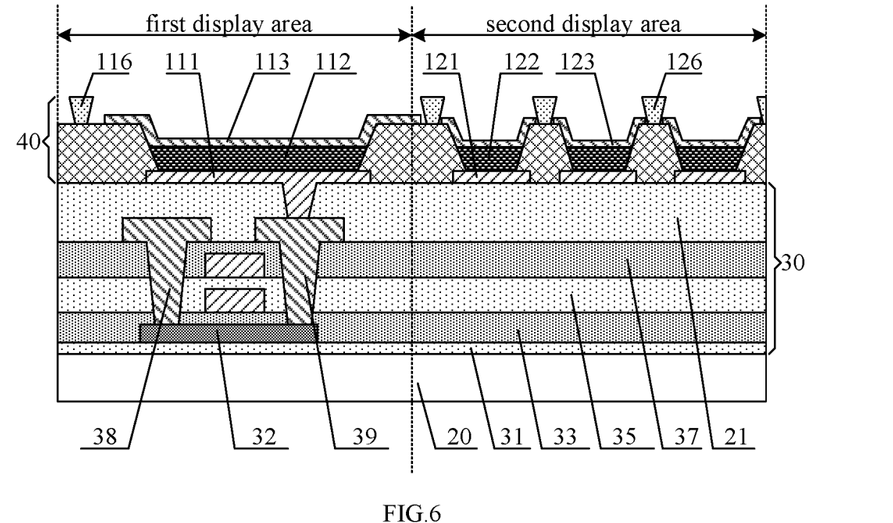
FIG. 6 is a sectional view along line A-A' of FIG. 1.

FIG. 6 is a sectional view along line A-A' of FIG. 1. As shown in FIG. 6, the display panel includes a base substrate 20. The base substrate 20 may be formed of materials such as glass, polyimide (PI), or polycarbonate (PC). The display panel also includes an array layer 30 on the base substrate 20. The array layer 30 includes a Thin Film Transistor (TFT) in the first display area 11 and a driving circuit composed of a thin film transistor for controlling the first light-emitting device L1. A thin-film transistor is schematically shown in FIG. 6. This disclosure is illustrated in the example of a double-gate thin-film transistor, which is understandable that it is not limited to a double-gate type, but can also be single-gate, top-gate, or bottom-gate thin-film transistor.

Specifically, in the first display area, the display panel includes a buffer layer 31 on the base substrate 20, an active layer 32 on the thin-film transistor layer 31, a first gate insulating layer 33 on the active layer 32, a first gate electrode 34 on the first gate insulating layer 33, a second gate insulating layer 35 on the first gate electrode 34, a second gate electrode 36 on the second gate insulating layer 35, an interlayer insulating layer 37 on the second gate electrode 36, a source electrode 38 and the drain electrode 39 on the interlayer insulating layer 37. The source electrode 38 and drain electrode 39 are connected to active layer 32 by a via-hole passing through the interlayer insulating layer 37, the second gate insulating layer 35 and the first gate insulating layer 33. The array layer 30 may also include a planarization layer 21 on the source electrode 38 and the drain electrode 39. A material of planarization layer 21 may include organic resins such as PI, and planarization layer 21 has a planarization effect.

The display panel also includes a light-emitting functional layer 40 on the array layer 30, which includes the first subpixel (i.e., AMOLED subpixel) in the first display area 11, and the second subpixel (i.e., PMOLED subpixel) in the second display area 12. In the first display area, each pixel unit includes multiple first subpixels; in the second display area, each pixel unit includes multiple second subpixels, and multiple second subpixels in a pixel unit may be arranged in a array form or in a form of Chinese character "品". The first subpixel includes the first electrode 111 on the planarization layer 21, the first electrode 111 is connected to the drain electrode of the thin film transistor through a via-hole in the planarization layer 21. The first subpixel also includes the first pixel definition layer 114 on the first electrode 111. The first pixel definition layer 114 has a first opening 115 that exposes the first electrode 111. The first subpixel also includes a first light-emitting structure layer 112 in the first opening 115 and on the first pixel definition layer 114 and a second electrode 113 on the first light-emitting structure layer 112.

In the second display area, the display panel includes an insulating layer on the base substrate 20, a planarization layer 21 on the insulating layer, where the insulating layer includes a buffer layer 31 formed during the formation of TFT, a first gate insulating layer 33, a second gate insulating layer 35, and an interlayer insulating layer 37. The second subpixel includes the third electrode 121 on the planarization layer 21 and the second pixel defined layer 124 on the third electrode 121. The second pixel defines that layer 124 has a second opening 125 that exposes the third electrode 121. In the second display area, the display panel further includes a partition structure layer on the second pixel definition layer 124, the partition structure layer includes a stripe-like first partition pad 126 located between two adjacent rows or two adjacent columns of pixel units. The second subpixel further includes a second light-emitting structure layer 122 on the third electrode 121 and in the second opening 125, and the fourth electrode layer on the partition structure layer and the second light-emitting structure layer 122, the first partition pad 126 is configured to separate the fourth electrode layer into stripe-like fourth electrodes 123 that are disconnected from each other.

In order to separate the fourth electrode layer into stripe-like-like fourth electrodes 123 that are disconnected from each other, an orthographic projection of a surface of the first partition pad 126 adjacent to the base substrate 20 onto the base substrate 20 is within an orthographic projection of a surface of the first partition pad 126 away from the base substrate 20 onto the base substrate 20, as shown in FIG. 6. The first partition pad 126 has a structure with a small bottom and a large top, such as an inverted trapezoid and mushroom-shaped structure. Thus, when the second light-emitting structure layer 122 is formed through a deposition or steaming process, the light-emitting functional layers of adjacent pixel units are separated by the first partition pad 126, which avoids pixel interference in the second display area. At the same time, when the fourth electrode 123 is formed in the second display area, the first partition pad 126 may disconnect the fourth electrodes adjacent two rows or columns of pixel units, thereby making the fourth electrodes (usually the cathode) to be stripe-like electrodes disconnected from each other, and satisfying the normal driving of the PMOLED.

It is easy to understand that if the third electrodes on each row are electrically connected, the first partition pad 126 is between adjacent two rows of pixel units, so that the first partition pad 126 may separate the fourth electrode into disconnected stripe-like electrode rows, with the fourth electrodes in each row electrically connected; if the third electrodes on each row are electrically connected, the first partition pad 126 is arranged between adjacent two columns of pixel units. Thus, the first partition pad 126 may separate the fourth electrodes into stripe-like electrode columns that are disconnected from each other, with the fourth electrodes in each column electrically connected, thereby satisfying the driving mode of the PMOLED.

In some embodiments of the present disclosure, the second partition pad 116 may also be arranged in the first display area, and the second partition pads 116 are distributed in the first display area, the first partition pad 116 is on the first pixel definition layer 114 and between the two first openings 115, and a first light-emitting structure layer 112 is on the first electrode 111 within the first opening 115.

In some embodiments of the present disclosure, in order to reduce the number of masking processes of the display panel, the first electrodes 111 and third electrodes 121 are formed by a single masking process, the first pixel definition layer 114 and the second pixel definition layer 124 are formed by a single masking process, the first partition pad in the first display area and the second partition pad in the second display are formed by a single masking process, and the first light-emitting structure 112 and the second light-emitting structure 122 are formed by a single masking process. The second electrode 113 and fourth electrode 123 are formed by a single masking process.

In some embodiments of this disclosure, a material of the first partition pad 126 includes a negative photoresist.

A method of forming a display panel as shown in FIG. 6 is further provided in some embodiments of the present disclosure, the display panel includes a first display area and a second display area, and the method includes:

forming an array layer on a base substrate;

forming, at a side of the array layer away from the base substrate, an AMOLED subpixel in the first display area and a PMOLED subpixel in the second display area;

where the forming at the side of the array layer away from the base substrate the PMOLED subpixel in the second display area includes:

forming, on the array layer, a plurality of third electrodes arranged in an array form in the second display area;

forming a second pixel definition layer on the third electrodes, where the second pixel definition layer includes second openings exposing the third electrodes;

forming a partition structure layer on the second pixel definition layer, where the partition structure layer includes a first partition pad between adjacent two rows or columns of pixel units; and depositing a transparent conductive thin film on a resultant base substrate, where the transparent conductive thin film is separated into bar-like fourth electrodes by the first partition pad in the second display area.

According to the method of forming the display panel in the embodiments of the present disclosure, when forming the PMOLED subpixel in the second display area and before forming the fourth electrode, the partition structure layer is formed on the second pixel definition layer, the partition structure layer includes the first partition pad between adjacent two rows or columns of pixel units. Therefore, when depositing the transparent conductive thin film, the transparent conductive thin film in the second display area may be separated into bar-like fourth electrodes by the first partition pad, so the fourth electrodes may be formed without an independent patterning process. Therefore, the fourth electrode of the PMOLED subpixel and the cathode of the AMOLED subpixel may be formed simultaneously, thereby simplifying the forming process of the display panel and reducing the cost.

In some embodiments of the present disclosure, an orthographic projection of a surface of the first partition pad adjacent to the base substrate onto the base substrate is within an orthographic projection of a surface of the first partition pad away from the base substrate onto the base substrate.

In some embodiments of the present disclosure, prior to the depositing the transparent conductive thin film on the resultant base substrate, the method further includes:

forming a second light-emitting structure layer in the second openings;

or prior to the forming the partition structure layer on the second pixel definition layer, the method further includes:

forming a second light-emitting structure layer in the second openings.

In some embodiments of the present disclosure, the forming, at the side of the array layer away from the base substrate, the AMOLED subpixel in the first display area includes:

forming, at the side of the array layer away from the base substrate, a first electrode in the first display area, where the first electrode and the third electrodes are formed by one patterning process;

forming a first pixel definition layer on the first electrode, where the first pixel definition layer includes a first opening exposing the first electrode, and the first pixel definition layer and the second pixel definition layer are formed by one masking process;

forming a first light-emitting structure layer in the first opening, where the first light-emitting structure layer and the second light-emitting structure layer are formed simultaneously; and forming a second electrode on the resultant base substrate, where the second electrode and the fourth electrodes are formed simultaneously.

In some embodiments of the present disclosure, a material of the second pixel definition layer includes a positive organic material, and a material of the first partition pad includes a negative organic material; or a material of the second pixel definition layer includes a negative organic material, and a material of the first partition pad includes a positive organic material.

The technical scheme of the present disclosure is described in detail below in conjunction with the forming process of the display panel. The "patterning process" mentioned in the example includes coating photoresist, mask exposure, development, etching, peeling photoresist, etc. It is a mature forming process. The deposition may use known processes such as sputtering, steaming, chemical vapor deposition, the coating may use known coating processes, and the etching may use known method, which is not limited herein.

Figure 7A:
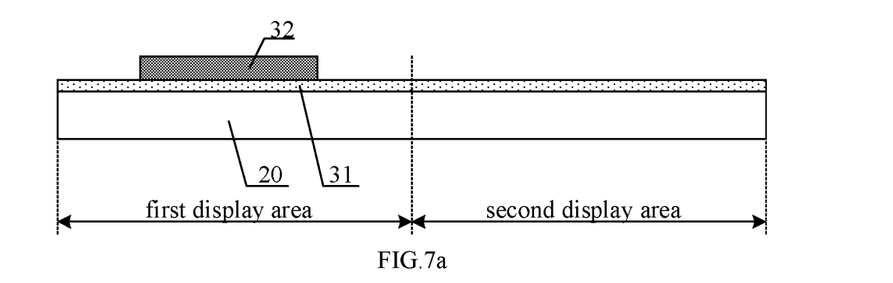
FIG. 7a is a schematic view of a display panel with an active layer in some embodiments of the present disclosure.

S1: forming an array layer 30 on the base substrate 20, which may include:

S11: forming a buffer layer 31 on the base substrate 20, depositing an active film on the buffer layer 31, forming an active layer 32 by a patterning process, where the active layer 32 is in the first display area 11. As shown in FIG. 7a which is a schematic view of a display panel with an active layer in some embodiments of the present disclosure. The base substrate may a glass substrate or flexile substrate (e.g., PI substrate), the buffer layer may include a silicon nitride layer, a silicon oxide layer or a composite layer of silicon nitride and silicon oxide layer, and the like.

Figure 7B:
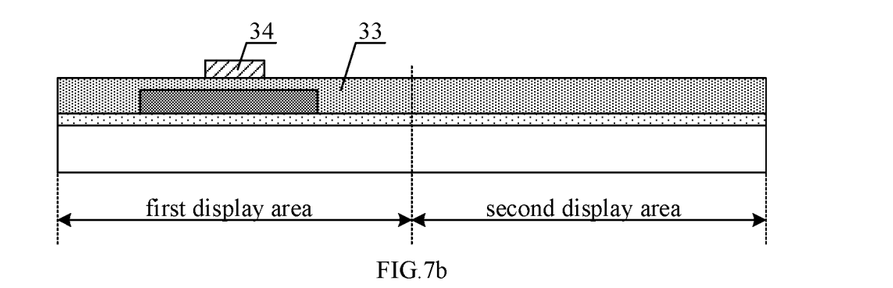
FIG. 7b is a schematic view of a display panel with a first gate electrode in some embodiments of the present disclosure.

S12: forming a first gate insulating layer 33 on buffer layer 31, depositing a gate conductive film on the first gate insulating layer 33, and forming a first gate electrode 34 by a patterning process. The first gate electrode 34 is in the first display area 11. As shown in FIG. 7b which is a schematic view of a display panel with a first gate electrode in some embodiments of the present disclosure. The first gate insulating layer 33 may be made of silicon nitride SiNx, silicon oxide SiOx or a composite layer of SiNx/SiOx, and the first gate electrode may be made of one or more metals such as platinum Pt, ruthenium Ru, gold Au, silver Ag, molybdenum Mo, chromium Cr, aluminum, tantalum Ta, titanium Ti, tungsten W, etc.

Figure 7C:
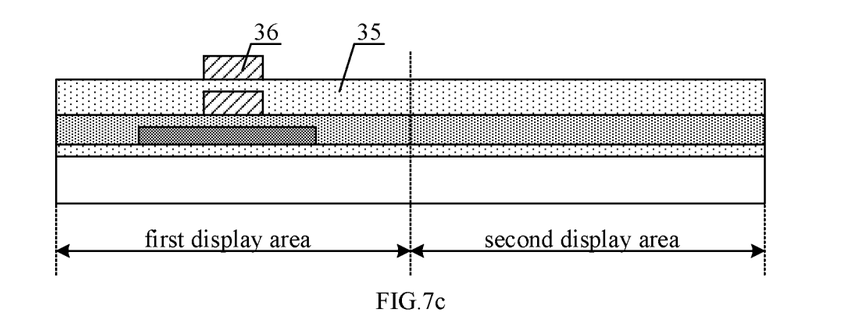
FIG. 7c is a schematic view of a display panel with a second gate electrode in some embodiments of the present disclosure.

S13: forming a second gate insulating layer 35 on the first gate electrode 34, depositing a gate conducting film on the second gate insulating layer 35, and forming a second gate electrode 36 by a patterning process. The second gate electrode 36 is in the first display area 11. As shown in FIG. 7c which is a schematic view of a display panel with a second gate electrode in some embodiments of the present disclosure. The second gate insulating layer 33 may be made of silicon nitride SiNx, silicon oxide SiOx or a composite layer of SiNx/SiOx, and the second gate electrode may be made of one or more metals such as platinum Pt, ruthenium Ru, gold Au, silver Ag, molybdenum Mo, chromium Cr, aluminum, tantalum Ta, titanium Ti, tungsten W, etc.

Figure 7D:
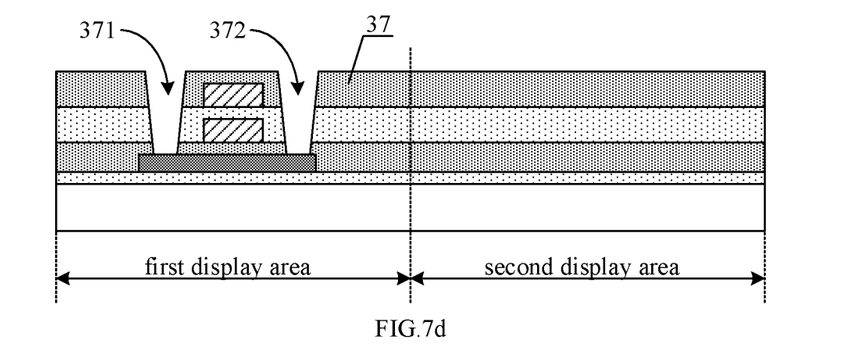
FIG. 7d is a schematic view of a display panel with an inter-layer insulating layer in some embodiments of the present disclosure.

S14: forming an interlayer insulating layer 37 on the second gate electrode 36, where the interlayer insulating layer 37 has a first via-hole 371 and a second via-hole 372 passing through the interlayer insulating layer 37, the second gate insulating layer 35 and a first gate insulating layer 33 to expose the active layer 32 Specifically, S14 includes: depositing an interlayer insulating thin film on second gate electrode 36; forming the first via-hole 371 and the second via-hole 372 passing through the interlayer insulating layer 37, the second gate insulating layer 35 and a first gate insulating layer 33, where the active layer 32 is exposed through the first via-hole 371 and the second via-hole 372, as shown in FIG. 7d which is a schematic view of a display panel with an inter-layer insulating layer in some embodiments of the present disclosure.

Figure 7E:
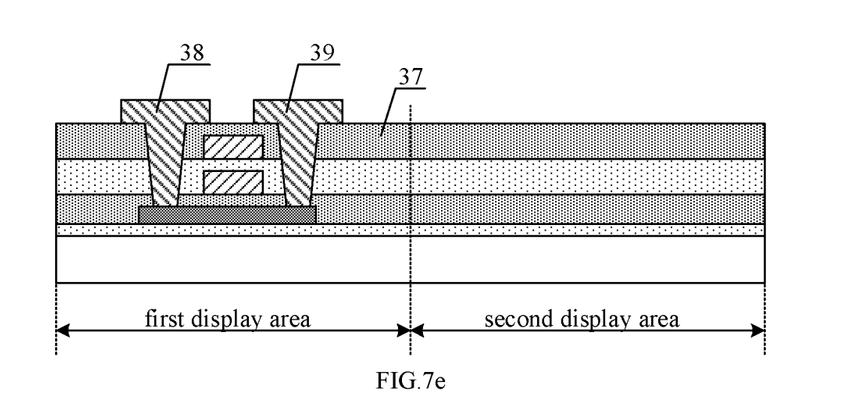
FIG. 7e is a schematic view of a display panel with source and drain electrodes in some embodiments of the present disclosure.
Figure 7F:
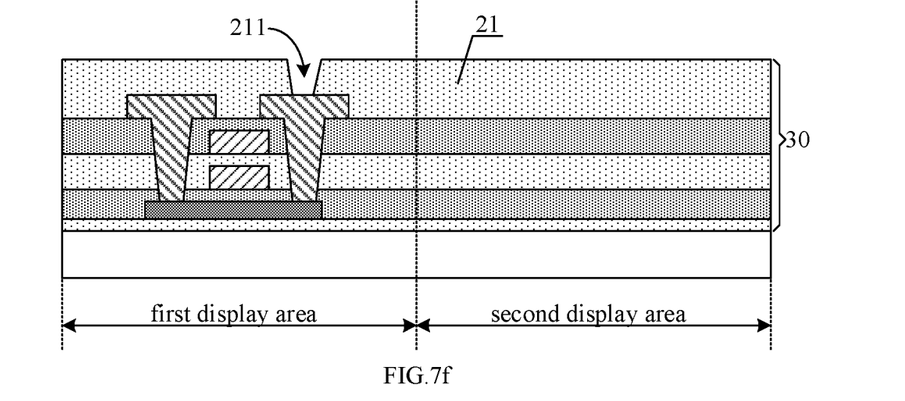
FIG. 7f is a schematic view of a display panel with a planarization layer in some embodiments of the present disclosure.

S15: depositing the source/drain metal film on the interlayer insulating layer 37, forming the source electrode 38 and drain electrode 39 in the first display area by a patterning process. The source electrode 38 is electrically connected to the active layer 32 through the first via-hole 371, and the drain electrode 39 is electrically connected to the active layer 32 through the second via-hole 372, as shown in FIG. 7e which is a schematic view of a display panel with source and drain electrodes in some embodiments of the present disclosure.

S16: forming a planarization layer 21 on the source/drain electrodes, where the planarization layer 21 has a third via-hole 211 to expose the drain electrode 39, as shown in FIG. 7 which is a schematic view of a display panel with a planarization layer in some embodiments of the present disclosure. The process of forming the planarization layer 21 is a common technology in this field, which will not be repeated here.

When forming the array layer 30, the active film, the two layers of gate conductive film and the source/drain metal film in the second display area are all etched, while the buffer layer, the first gate insulating layer, the second gate insulating layer and the interlayer insulating layer are all remained, so that after forming the planarization layer 21, the first display area and the second display area may remain on the same horizontal plane, which is conducive to make the first electrode and third electrode to be formed to locate on the same horizontal plane.

Figure 8A:
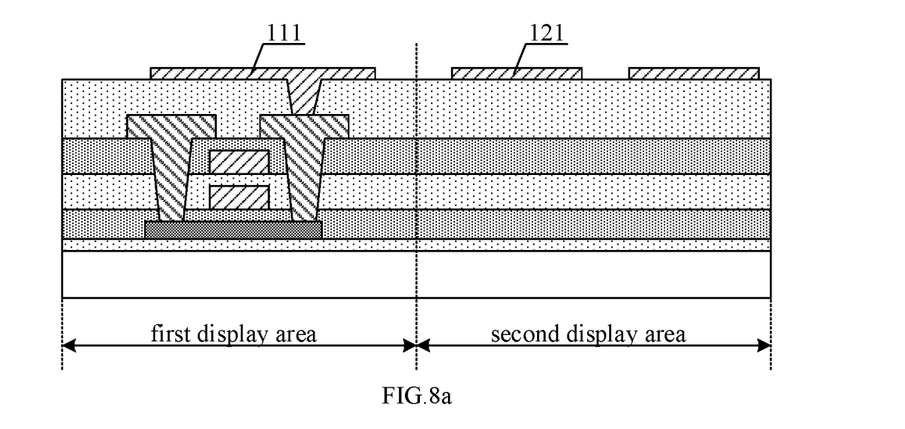
FIG. 8a is a schematic view of a display panel with a first electrode and a second electrode in some embodiments of the present disclosure.

S2: forming a light-emitting functional layer 40 at a side of the array layer 30 away from the substrate 20. The light-emitting functional layer 40 includes AMOLED subpixels in the first display area and PMOLED subpixels in the second display area, and S2 further includes:

S21: forming, on the array 30, a first electrode 111 in the first display area and a third electrode 121 in the second display area. Specifically, the method includes: forming a conductive film on the planarization layer 21, forming the first electrode 111 in the first display area and the third electrode 121 in the second display area by one patterning process, and a third electrode 121 in the second display area, as shown in FIG. 8a which is a schematic view of a display panel with a first electrode and a second electrode in some embodiments of the present disclosure. The materials of the first electrode 111 and third electrode 121 may include ITO/Ag/ITO, etc.

The display panel has a PMOLED structure in the second display area, when the third electrode connection 130 is formed, the connecting line of the third electrodes 121 in the same column is formed at the same time, i.e., the third electrode connecting line 130 configured to electrically connect the third electrodes in the same column is formed. After forming the third electrode, the plan structure of the second display area is shown in FIG. 4, FIG. 5a, FIG. 5B or FIG. 5c.

Figure 8B:
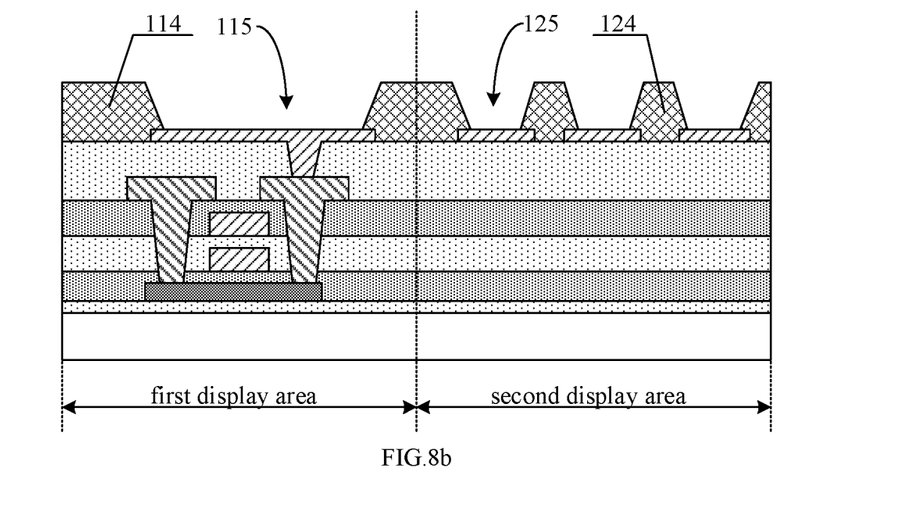
FIG. 8b is a schematic view of a display panel with a first pixel definition layer and a second pixel definition layer in some embodiments of the present disclosure.

S22: forming a first pixel definition layer 114 in the first display area on the first electrode 111, forming a second pixel definition layer 124 in the second display area on the third electrode 121, where the first pixel definition layer 114 has a first opening 115 that exposes the first electrode 111, the second pixel definition layer 124 has a second opening 125 that exposes the third electrode 121. The first pixel definition layer 114 and the second pixel definition layer 124 are formed by a single masking process. Specifically, the method further includes: coating a pixel definition layer on the base substrate having the first and third electrodes, exposing and developed the pixel definition film by a mask, to remove the pixel definition film at the first opening 115 and the second opening 125, the first pixel definition layer is formed in the first display area 114, and the second pixel definition layer is formed in the second display area 124, as shown in FIG. 8B which is a schematic view of a display panel with a first pixel definition layer and a second pixel definition layer in some embodiments of the present disclosure.

Figure 8C:
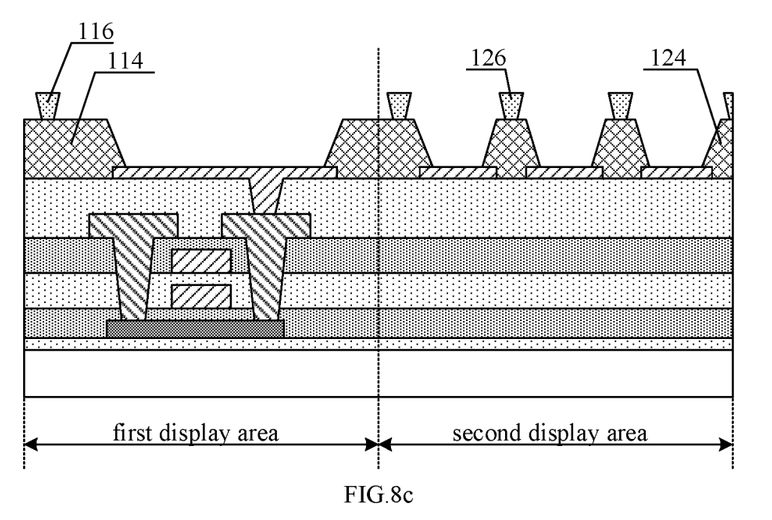
FIG. 8c is a schematic view of a display panel with a first partition pad in some embodiments of the present disclosure.

S23: forming a partition structure layer on the second pixel definition layer 124, where the partition structure layer includes a plurality of first partition pads 126, the first partition pad 126 is between two adjacent rows or two adjacent columns of pixel units, the first partition pad 126 is of a stripe-like shape, an orthographic projection of a surface of the first partition pad 126 adjacent to the base substrate 20 onto the base substrate 20 is within an orthographic projection of a surface of the first partition pad 126 away from the base substrate 20 onto the base substrate 20. As a result, the first partition pad 126 has a large top and small bottom structure, having an inverted trapezoidal or mushroom-shaped section on a plane perpendicular to the base substrate 20, as shown in FIG. 8c which is a schematic view of a display panel with a first partition pad in some embodiments of the present disclosure. In some embodiments of the present disclosure, the material of the second pixel definition layer is a positive organic material (an organic material with the same lighting performance as a positive photoresist), such as a positive photoresist, then the material of the first partition pad includes a negative organic material (an organic material with the same lighting performance as a negative photoresist), such as a negative photoresist, so that the first partition pad 126 has no effect on the second pixel definition layer. It is easy to understand that when the material of the second pixel definition layer is negative organic material, the material that of the first partition pad includes a positive organic material. Therefore, the material of the first partition pad has the opposite light performance as that of the second pixel definition layer.

In some embodiments of the present disclosure, when forming a first partition pad 126 on the second pixel definition layer 124, several second partition pads 116 are formed on the first pixel definition layer 114, the second partition pads 116 are distributed, the second partition pad 116 may be of a column structure and or a short stripe-like structure, and an orthographic projection of a surface of the second partition pad 116 adjacent to the base substrate 20 onto the base substrate 20 is within an orthographic projection of a surface of the second partition pad 116 away from the base substrate 20 onto the base substrate 20, for example, the section of the second partition pad has an inverted trapezoidal or mushroom shape, as shown in FIG. 8C.

The process of forming the first partition pads 126 and second partition pads 116 may include: coating a partition pad thin film on the base substrate having the first definition layer 114 and the second pixel definition layer 124, exposing and developing the partition pad thin film by a mask plate, remaining the partition pad thin film at the positions corresponding to the first and second partition pads, and removing the partition pad film at other positions, to form the first partition pad 126 and the second partition pad 116, as shown in FIG. 8C. The first and second partition pads may be formed using conventional techniques in the field, which will not be described here.

S24: forming a first light-emitting structure layer 112 in the first opening, and forming a second light-emitting structure layer 122 in the second opening. The first light-emitting structure layer and the second light-emitting structure layer may be formed by conventional techniques in the field, such as steaming.

In other embodiments of the present disclosure, S24 may be followed by the S23. In this case, S23 is followed by the S24. It is easy to understand that the light-emitting functional layer may include a hole-injection layer, a hole-transport layer, an organic light-emitting layer, and an electron transport layer. When a light-emitting functional layer is formed, the hole-transport layer of adjacent pixel units is usually an integral film layer, that is, the hole-transport layer of adjacent pixel units is connected. Therefore, after the first partition pad is formed, the first partition pad may separate the hole-transport layer of adjacent pixel units, thereby avoiding the interference of adjacent pixel units and improving the display performance.

S25: forming a second electrode in the first display area, and forming a fourth electrode in the second display area. Under the action of the first partition pad, the fourth electrodes are a stripe-like electrodes separated with each other. The method further includes: depositing a transparent conductive film on the base substrate having the second partition pad 126, the first light-emitting structure layer 112, and the second light-emitting structure layer 122. The transparent conductive film in the second display area is separated into stripe-like electrodes that are disconnected from each other by the first partition pads 126, thus the stripe-like fourth electrodes 123 that are disconnected from each other are formed in the second display area, as shown in FIG. 6. The transparent conductive film may be made of Indium Zinc Oxide (IZO), Indium Tin Oxide (ITO), etc.

Without the first partition pad 126, in order to make the second display area to meet the PMOLED driving structure, the transparent conductive thin film may be patterned, so as to form the stripe-like fourth electrodes disconnected from each other in the second display area. An etching process is required in the patterning process, and the etching process may damage the second and fourth electrodes, the pixel definition layer and the light-emitting functional layer, then the display will be affected.

In this embodiments, the first partition pad is formed prior to the forming the light-emitting functional layer, and when a transparent conductive film is subsequently deposited, the transparent conductive film may be separated by the first partition pad into stripe-like electrodes that are disconnected from each other, thus obtaining stripe-like fourth electrodes that are disconnected from each other, satisfying the driving structure of PMOLED. In addition, a first partition pad is formed before the light-emitting functional layer and the fourth electrodes are formed, which will not affect the subsequent formation of the light-emitting functional layer and the fourth electrode, thereby ensuring the display effect of the display panel.

Because the second partition pads 116 are distributed, the second partition pad 116 will not separate the second electrode in the first display area. The second electrodes in the first display area are still electrically connected as one electrode, thereby ensuring the AMOLED driving structure in the first display area.

Figure 9:
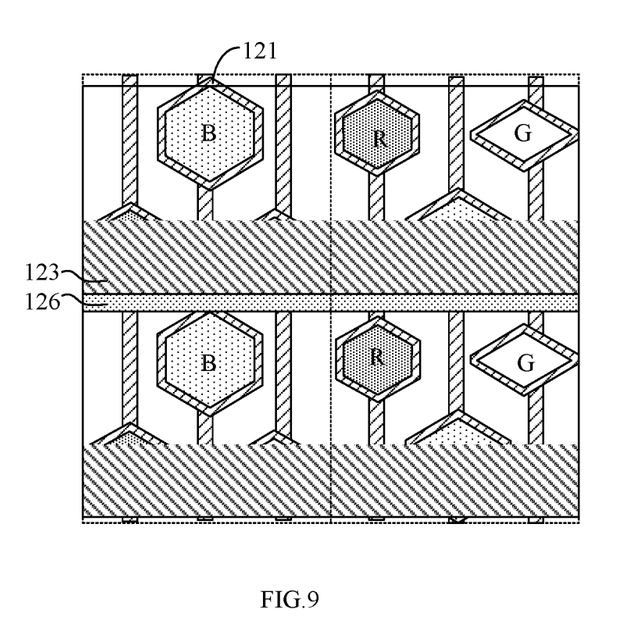
FIG. 9 is a plan view of a light-emitting functional layer in a second display area in some embodiments of the present disclosure.

FIG. 9 is a plan view of a light-emitting functional layer in a second display area in some embodiments of the present disclosure. It is easy to understand that if the third electrodes in each column are electrically connected, the first partition pad 126 is arranged between adjacent two rows of pixel units, so that the first partition pad 126 may separate the fourth electrode into disconnected stripe-like electrode rows, with the fourth electrode electrically connected in each row. If the third electrodes in each row are electrically connected, the first partition pad 126 is arranged between adjacent two columns of pixel units. Thus, the first partition pad 126 may separate the fourth electrodes into stripe-like electrodes that are disconnected from each other, with the fourth electrode electrically connected in each column, thereby satisfying the driving mode of PMOLED. In FIG. 9, the subpixels in the pixel unit are arranged in a form of Chinese character "吅", the third electrodes 121 in each column are connected, and the first partition pad 126 is arranged between adjacent two rows of pixel units, the first partition pad 126 separates the fourth electrode into stripe-like electrode rows that are disconnected from each other, that is, the stripe-like fourth electrode 123 extends in a row direction, and a plurality of stripe-like fourth electrodes 123 are arranged in a column direction. When a plurality of subpixels in the pixel unit are arranged in an array form and the third electrodes in each column are connected, the first partition pad is still arranged between adjacent two rows of pixel units.

According to the method of forming display panel in the embodiments of the present disclosure, the first and third electrodes are formed by a single patterning process, the pixel definition layer and the second pixel definition layer are formed by a single masking process, the first and second light-emitting structure layers are formed simultaneously, and the second and fourth electrodes are formed simultaneously. Thus, the PMOLED subpixels and the AMOLED subpixels may be formed simultaneously, thereby simplifying the method of forming the display panel and reducing the production cost of display panel.

Figure 10:
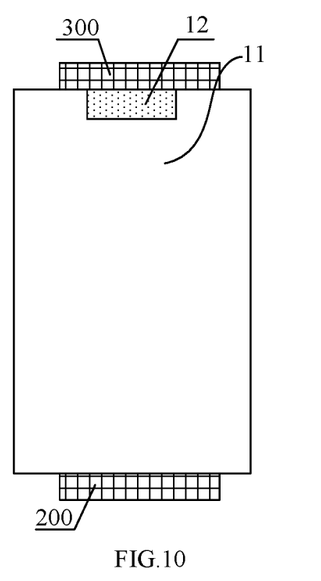
FIG. 10 is a schematic view of a display device in some embodiments of the present disclosure.

FIG. 10 is a schematic view of a display device in some embodiments of the present disclosure. A display device is further provided in the embodiments of the present disclosure, as shown in FIG. 10. The display device includes the display panel hereinabove, as shown in FIG. 10. The display device further includes the first control circuit 200 electrically connected to the driving circuit 100 in the first display area and the second control circuit 300 electrically connected to the first voltage signal line Seg and the second voltage signal line Com in the second display area. The first control circuit 200 is configured to control the driving circuit 100, thereby controlling the display of the first display area, and the second control circuit 300 is configured to control the display of the second display area.

In some embodiments of the present disclosure, the first control circuit 200 and the second control circuit 300 are located at opposite sides of the display panel.

In the specific implementation, the display device also includes a sensor module, such as a camera, an infrared sensor, a handset, etc. The sensor module is arranged in the second display area of the display panel and on the backlight side of the display panel, with the light-sensitive side of the sensor module facing the display panel.

The display device in some embodiments of the present disclosure is a full-screen display device.

The display device of the present disclosure may be any product or part with display function such as a mobile phone, a tablet computer, a TV, a display, a notebook computer, a digital photo frame, a navigator, etc.

In the description of the embodiments of the present disclosure, it is to be understood that the orientation or location relationship indicated by the terms "middle", "top", "bottom", "front", "back", "vertical", "horizontal", "top", "bottom", "inside", "outside" is based on the orientation or location relationship shown in the drawings and is intended only to facilitate the description of this disclosure and simplify the description, which is not to indicate or imply that the device or component must have a specific orientation, be constructed and operated in a specific orientation, and therefore cannot be understood as a limitation of the disclosure.

In the description of present disclosure, it is important to note that, unless otherwise explicitly specified and defined, the terms "installation", "connection", "connected" should be understood in a broad sense, for example, it may be a fixed connection, a detachable connection, or an integrated connection; it may be a mechanical connection or an electrical connection; it may be a direct connection or an indirect connection through an intermediate medium, or a connection between two elements. For ordinary skilled in the art, the specific meaning of the above terms in this disclosure may be understood in specific circumstances.

The above are merely some embodiments of the present disclosure. A person skilled in the art may make further modifications and improvements without departing from the principle of the present disclosure, and these modifications and improvements shall also fall within the scope of the present disclosure.

What is claimed is:

1. A method of forming a display panel, wherein the display panel comprises a first display area and a second display area, and the method comprises: forming an array layer on a base substrate;

forming, at a side of the array layer away from the base substrate, an AMOLED subpixel in the first display area and a PMOLED subpixel in the second display area;

wherein the forming at the side of the array layer away from the base substrate the PMOLED subpixel in the second display area comprises:

forming, on the array layer, a plurality of third electrodes arranged in an array form in the second display area;

forming a second pixel definition layer on the third electrodes, wherein the second pixel definition layer comprises second openings exposing the third electrodes;

forming a partition structure layer on the second pixel definition layer, wherein the partition structure layer comprises a first partition pad between adjacent two rows or columns of pixel units; and depositing a transparent conductive thin film on a resultant base substrate, wherein the transparent conductive thin film is separated into bar-like fourth electrodes by the first partition pad in the second display area, wherein prior to the depositing the transparent conductive thin film on the resultant base substrate, the method further comprises: forming a second light-emitting structure layer in the second openings; or prior to the forming the partition structure layer on the second pixel definition layer, the method further comprises: forming a second light-emitting structure layer in the second openings, and wherein the forming, at the side of the array layer away from the base substrate, the AMOLED subpixel in the first display area comprises: forming, at the side of the array layer away from the base substrate, a first electrode in the first display area, wherein the first electrode and the third electrodes are formed by one patterning process; forming a first pixel definition layer on the first electrode, wherein the first pixel definition layer comprises a first opening exposing the first electrode, and the first pixel definition layer and the second pixel definition layer are formed by one masking process; forming a first light-emitting structure layer in the first opening, wherein the first light-emitting structure layer and the second light-emitting structure layer are formed simultaneously; and forming a second electrode on the resultant base substrate, wherein the second electrode and the fourth electrodes are formed simultaneously.

2. The method according to claim 1, wherein an orthographic projection of a surface of the first partition pad adjacent to the base substrate onto the base substrate is within an orthographic projection of a surface of the first partition pad away from the base substrate onto the base substrate.

3. The method according to claim 1, wherein
a material of the second pixel definition layer comprises a positive organic material, and a material of the first partition pad comprises a negative organic material; or
a material of the second pixel definition layer comprises a negative organic material, and a material of the first partition pad comprises a positive organic material.

4. A display panel, comprising:
a first display area;
a second display area;
a base substrate;
an array layer on the base substrate; and
a light-emitting functional layer at a side of the array layer away from the base substrate, wherein the light-emitting functional layer comprises an AMOLED subpixel in the first display area and a plurality of PMOLED subpixels in the second display area;
wherein the PMOLED subpixels are arranged in an array form and comprises third electrodes, a second pixel definition layer is on the third electrodes, the second pixel definition layer comprises second openings exposing the third electrodes, a partition structure layer is on the second pixel definition layer and comprises a first partition pad between adjacent two rows or columns of pixel units;
the PMOLED subpixels further comprise a second light-emitting structure in the second opening and on the third electrodes and a transparent conductive thin film on the partition structure layer, and the transparent conductive thin film is separated into bar-like fourth electrodes by the first partition pad,
wherein in the second display area, each pixel unit comprises a red subpixel, a green subpixel and a blue subpixel, and an aperture ratio of each pixel unit is 15% to 25%,
wherein in each pixel unit, lines connecting centers of the red subpixel, the green subpixel and the blue subpixel form a triangle, and
wherein an interval between adjacent two PMOLED subpixels is 26.4 μm to 32 μm.

5. The display panel according to claim 4, wherein an orthographic projection of a surface of the first partition pad adjacent to the base substrate onto the base substrate is within an orthographic projection of a surface of the first partition pad away from the base substrate onto the base substrate.

6. The display panel according to claim 4, wherein the array layer comprises a thin-film transistor in the first display area, the AMOLED subpixel comprises a first electrode electrically connected to the thin-film transistor, a first pixel definition layer is on the first electrode, the first pixel definition layer comprises a first opening exposing the first electrode, a second partition pad is on the first pixel definition layer, the first partition pad and the second partition pad are formed simultaneously;
the AMOLED subpixel further comprises a first light-emitting structure layer in the first opening and on the first electrode and the first electrode definition layer and a second electrode on the first light-emitting structure layer.

7. The display panel according to claim 4, wherein a material of the fourth electrode comprises a transparent conductive material.

8. The display panel according to claim 4, wherein the blue subpixel has a pattern of a first regular hexagon, the red subpixel has a pattern of a second regular hexagon, and the green subpixel has a rhombus shape, and the pattern of the blue subpixel is larger than the pattern of the red subpixel.

9. The display panel according to claim 4, wherein in the second display area, the third electrodes of adjacent two subpixels with a same color in a same column are connected via a third electrode connecting line, wherein the third electrode connecting line is zigzag.

10. The display panel according to claim 9, wherein the third electrode connecting line comprises a plurality of curved segments, or the third electrode connecting line has an S-shape; or, the third electrode connecting line comprises a first curved segment and a second curved segment having opposite bending directions.

11. The display panel according to claim 9, wherein a width of third electrode connecting line is 4 μm to 6 μm.

12. A display device comprising:
a display panel, wherein the display panel comprises:
a first display area;
a second display area;
a base substrate;
an array layer on the base substrate; and
a light-emitting functional layer at a side of the array layer away from the base substrate,
wherein the light-emitting functional layer comprises an AMOLED subpixel in the first display area and a plurality of PMOLED subpixels in the second display area;
wherein the PMOLED subpixels are arranged in an array form and comprises third electrodes, a second pixel definition layer is on the third electrodes, the second pixel definition layer comprises second openings exposing the third electrodes, a partition structure layer is on the second pixel definition layer and comprises a first partition pad between adjacent two rows or columns of pixel units; the PMOLED subpixels further comprise a second light-emitting structure in the second opening and on the third electrodes and a transparent conductive thin film on the partition structure layer, and the transparent conductive thin film is separated into bar-like fourth electrodes by the first partition pad, wherein in the second display area, each pixel unit comprises a red subpixel, a green subpixel and a blue subpixel, and an aperture ratio of each pixel unit is 15% to 25%, wherein in each pixel unit, lines connecting centers of the red subpixel, the green subpixel and the blue subpixel form a triangle, and wherein an interval between adjacent two PMOLED subpixels is 26.4 μm to 32 μm.

13. The display device according to claim 12, further comprising a first control circuit electrically connected to a driving circuit in the first display area and a second control circuit electrically connected to a first voltage signal line and a second voltage signal line in the second display area;

wherein the first control circuit is configured to control the driving circuit, to control the first display area to display, the second control circuit is configured to control the second display area to display.

\* \* \* \* \*